(12) United States Patent
Jung

(10) Patent No.: US 10,204,664 B2
(45) Date of Patent: Feb. 12, 2019

(54) NONVOLATILE MEMORY DEVICE, NONVOLATILE MEMORY SYSTEM, AND OPERATING METHOD OF NONVOLATILE MEMORY

(71) Applicant: SK hynix Inc., Gyeonggi-do (KR)

(72) Inventor: Sung-Hyun Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/893,048

(22) Filed: Feb. 9, 2018

(65) Prior Publication Data
US 2018/0166106 A1    Jun. 14, 2018

Related U.S. Application Data

(62) Division of application No. 14/955,731, filed on Dec. 1, 2015, now Pat. No. 9,928,885.

(30) Foreign Application Priority Data

Jul. 29, 2015    (KR) ........................ 10-2015-0107135

(51) Int. Cl.
| | |
|---|---|
| G11C 5/14 | (2006.01) |
| G11C 16/12 | (2006.01) |
| G11C 16/30 | (2006.01) |
| G11C 16/04 | (2006.01) |
| G11C 16/32 | (2006.01) |

(52) U.S. Cl.
CPC ............. *G11C 5/147* (2013.01); *G11C 5/145* (2013.01); *G11C 16/0483* (2013.01); *G11C 16/12* (2013.01); *G11C 16/30* (2013.01); *G11C 16/32* (2013.01)

(58) Field of Classification Search
CPC ..... G11C 5/147; G11C 16/0483; G11C 16/12; G11C 16/145; G11C 16/30; G11C 16/32
See application file for complete search history.

(56) References Cited

U.S. PATENT DOCUMENTS

| | | | |
|---|---|---|---|
| 7,626,865 B2 * | 12/2009 | Ha ...................... | G11C 16/30 |
| | | | 365/185.18 |
| 8,874,828 B2 * | 10/2014 | Fai ...................... | G11C 16/12 |
| | | | 711/103 |

* cited by examiner

*Primary Examiner* — Harry W Byrne
*Assistant Examiner* — R Lance Reidlinger
(74) *Attorney, Agent, or Firm* — IP & T Group LLP

(57) ABSTRACT

A nonvolatile memory device may include a nonvolatile memory device may include a nonvolatile memory cell array; a peripheral circuit suitable for: activating an operation voltage in response to an operation voltage activation command, performing an operation to the nonvolatile memory cell array using the activated operation voltage in response to an operation command, and deactivating the activated operation voltage in response to an operation voltage deactivation command after the performing of the operation; and a control circuit suitable for controlling the peripheral circuit to execute an intervening operation during the activating of the operation voltage, the performing of the operation, and the deactivating of the activated operation voltage.

12 Claims, 14 Drawing Sheets

NONVOLATILE MEMORY DEVICE, NONVOLATILE MEMORY SYSTEM, AND OPERATING METHOD OF NONVOLATILE MEMORY

CROSS-REFERENCE TO RELATED APPLICATION(S)

This application is a division of U.S. patent application Ser. No. 14/955,731 filed on Dec. 1, 2015, which claims priority of Korean Patent Application No. 10-2015-0107135, filed on Jul. 29, 2015. The disclosure of each of the foregoing applications is incorporated herein by reference in its entirety.

BACKGROUND

1. Field

Embodiments of the present invention relate to a nonvolatile memory device, a nonvolatile memory system, and an operating method for the device and system.

2. Description of the Related Art

Semiconductor devices may be generally classified into volatile, memory and nonvolatile memory devices. A volatile memory device has generally fast write and read speed, but it loses data stored therein when the power supply to the memory device is interrupted. A nonvolatile memory device may have relatively slower write and read speed, but retains stored data even when the power supply to the memory device is interrupted. Hence, a nonvolatile memory device may be employed to store data regardless of whether the power supply to the memory device may be interrupted or not. Examples of nonvolatile memory devices include read only memory (ROM), mask ROM (MROM), programmable ROM (PROM), erasable programmable ROM (EPROM), electrically erasable programmable ROM (EEPROM), flash memory, phase change random access memory (PRAM), magnetic RAM (MRAM), resistive RAM (RRAM), and ferroelectric RAM (FRAM) devices. Flash memory devices are widely used and may be classified into NOR or NAND type depending upon the type of gate logic employed.

Access operations of a nonvolatile memory device may include a program operation, a read operation, and an erase operation. A program operation may, for example, store data in the memory cells, a read operation may read data stored in memory cells, and an erase operation may erase data stored in a memory cell. Generally, program, read and/or erase operations, may be performed using various level operating voltages. Typically, a nonvolatile memory device may include a voltage generation circuit for generating such operating voltages.

Typically, a voltage generation circuit may be controlled so that it may become activated only when the nonvolatile memory device performs an access operation.

FIG. 1 is a diagram illustrating a program operation of a conventional nonvolatile memory device.

Referring to FIG. 1, when a program command PGM is received by the nonvolatile memory device from an external source, the nonvolatile memory device first activates a voltage generation circuit (PUMP_EN). When activation of the voltage generation circuit is completed (T1), the voltage generation circuit, generates one or more program voltages for a program operation. Next, the nonvolatile memory device performs an operation for programming nonvolatile memory cells using a program voltage (PROGRAM). An operation for programming a nonvolatile memory cell may include an operation for applying a program pulse to a program target cell. When a program is completed (T2), the nonvolatile memory device deactivates the voltage generation circuit and places it in a disabled or de-activated state (PUMP_DIS).

It is noted, that a conventional nonvolatile memory device may only sequentially perform the aforementioned operations, i.e. activating a voltage generation circuit, programming one or more memory cells, and deactivating the voltage generation circuit, without allowing intervention of any other operation in response to a program command PGM.

Hence, a conventional nonvolatile memory device is not suitable for receiving data and addresses until a voltage generation circuit is deactivated in response to a program command PGM. Accordingly, a conventional non-volatile memory device requires that addresses for selecting nonvolatile memory cells to be programmed and/or data to be stored in the memory cells need to be received by the memory device before a program command PGM is received (T0).

As a result, the operation of a conventional nonvolatile memory device may be inefficient.

SUMMARY

Various embodiments are directed to a nonvolatile memory device with improved operation efficiency, an operating method thereof and a nonvolatile memory system including the same.

In an embodiment, a nonvolatile memory device may include a nonvolatile memory cell array; a peripheral circuit suitable for: activating an operation voltage in response to an operation voltage activation command, performing an operation to the nonvolatile memory cell array using the activated operation voltage in response to an operation command, and deactivating the activated operation voltage in response to an operation voltage deactivation command after the performing of the operation; and a control circuit suitable for controlling the peripheral circuit to execute an intervening operation during the activating of the operation voltage, the performing of the operation, and the deactivating of the activated operation voltage.

The peripheral circuit may perform the activating the operation voltage, performing the operation and deactivating the operation voltage independently.

The operation voltage activation command, the operation command and the operation voltage deactivation command may be separate commands.

The intervening operation may include the peripheral circuit receiving one or more address and/or data from an external source The operation voltage activation command, the operation voltage deactivation command, and the operation command may be independently provided from an external source.

The control circuit may control the peripheral circuit to: latch the one or more address and/or data from the external source, and to program the latched data into the nonvolatile memory cell array in response to a program command as the operation command; read data from the nonvolatile memory cell array in response to a read command as the operation command, and to output the read data; and erase data of the nonvolatile memory cell array in response to an erase command as the operation command.

The execution of the intervening operation may commence after the activating of the operation voltage and before the performing of the operation in response to a program command as the operation command; and wherein after the performing the operation in response to a read operation as the operation command, the control circuit may control the peripheral circuit to output data read from the nonvolatile memory cell array.

The operation command may include two or more consecutive predetermined operation commands, and the control circuit may control the peripheral circuit to perform the activating the operation voltage, to perform the two or more predetermined operation commands consecutively, and the deactivating of the activated operation voltage In response to a second operation voltage activation command following a first operation voltage activation command, the control circuit may control the peripheral circuit to deactivate a first operation voltage, which is activated in response to the first operation voltage activation command, and activate a second operation voltage.

The peripheral circuit may include a voltage generation circuit comprising one or more first operation voltage pumps suitable for generating a first operation voltage, and the voltage generation circuit being activated in response to a first operation voltage activation command and deactivated in response to one or more of a second operation voltage activation command and the operation voltage deactivation command.

In an embodiment, a nonvolatile memory system may include: a memory controller suitable for independently providing an operation voltage activation command, an operation command and an operation voltage deactivation command; and a nonvolatile memory device including a nonvolatile memory cell array, and suitable for: activating an operation voltage in response to the operation voltage activation command, performing an operation to the nonvolatile memory cell array using the activated operation voltage in response to the operation command, and deactivating the activated operation voltage in response to the operation voltage deactivation command after the performing of the operation, wherein the nonvolatile memory device receives one or more of an address and an external data during the activating of the operation voltage, the performing of the operation, and the deactivating of the activated operation voltage, which are independently performed, and wherein the operation voltage activation command, the operation command, and the operation voltage deactivation command are independent from one another.

The nonvolatile memory device may latch the external data and programs the latched data into the nonvolatile memory cell array in response to a program command as the operation command, read data from the nonvolatile memory cell array in response to a read command as the operation command, and outputs the read data, and erase data of the nonvolatile memory cell array in response to an erase command as the operation command.

The nonvolatile memory device may latche the external data after the activating of the operation voltage and before the performing of the operation in response to a program command as the operation command. After the performing the operation in response to a read operation as the operation command, the nonvolatile memory device may output data read from the nonvolatile memory cell array.

The operation command may include consecutive two or more of the predetermined operation commands, and The nonvolatile device may perform the activating the operation voltage, perform a predetermined operation consecutively twice or more, and the deactivating of the activated operation voltage.

In response to a second operation voltage activation command following a first operation voltage activation command, the nonvolatile memory device may deactivate a first operation voltage, which is activated in response to the first operation voltage activation command, and activate a second operation voltage.

An operating method of a nonvolatile memory device including a nonvolatile memory cell array, the method may include: activating an operation voltage in response to an operation voltage activation command; performing an operation to the nonvolatile memory cell array using the activated operation voltage in response to an operation command; and deactivating the activated operation voltage in response to an operation voltage deactivation command after the performing of the operation, wherein one or more of an address and an external data are provided to the nonvolatile memory device during the activating of the operation voltage, the performing of the operation, and the deactivating of the activated operation voltage, which are independently performed, and wherein the operation voltage activation command, the operation command, and the operation voltage deactivation command are independent from one another.

The operating may further include providing the operation voltage activation command, the operation voltage deactivation command, and the operation command independently provided from an external source.

The performing of the operation may include: programming the external data into the nonvolatile memory cell array in response to a program command as the operation command; reading data from the nonvolatile memory cell array in response to a read command as the operation command, and outputting the read data; and erasing data of the nonvolatile memory cell array in response to an erase command as the operation command.

The operating method may further include latching the external data after the activating of the operation voltage and before the performing of the operation in response to a program command as the operation command.

The operating method may further include after the performing the operation in response to a read operation as the operation command, outputting data read from the nonvolatile memory cell array The operation command may include consecutive two or more of the predetermined operation commands, and the performing of the operation performs a predetermined operation consecutively twice or more between the activating the operation voltage and the deactivating of the activated operation voltage.

In an embodiment, a nonvolatile memory device may include a voltage generation circuit suitable for activating a program voltage, a read voltage, or an erase voltage in response to a program voltage activation command, a read voltage activation command, or an erase voltage activation command, respectively, and deactivating an activated voltage in response to a voltage deactivation command; a cell array suitable for comprising a plurality of nonvolatile memory cells and performing a cell operation using the program voltage, the read voltage, or the erase voltage in response to a program cell operation command, a read cell operation command, or an erase cell operation command, respectively; and a page buffer group suitable for comprising a plurality of page buffers for latching external input data when program is performed and latching data output by the cell array when read is performed.

The program voltage activation command, the read voltage activation command, the erase voltage activation command, the voltage deactivation command, the program cell operation command, the read cell operation command, and the erase cell operation command are received from an outside of the nonvolatile memory device.

The cell array may be suitable for: performing an operation for programming data latched in the page buffer group into selected memory cells of the plurality of nonvolatile memory cells in response to the program cell operation command, performing an operation for reading data stored in selected nonvolatile memory cells of the plurality of nonvolatile memory cells in response to the read cell operation command and outputting the read data to the page buffer group, and performing an operation for erasing data stored in selected nonvolatile memory cells of the plurality of nonvolatile memory cells in response to the erase cell operation command.

The page buffer group may suitable for: latching the external input data between a point of time at which the program voltage activation command is received and a point of time at which a cell operation is started, and externally outputting data which has been output by the cell array and latched when a cell operation corresponding to the read cell operation command is completed.

When a program cell operation may be consecutively performed more than twice, the program voltage activation c and is received, the program cell operation command may be consecutively received more than twice, and the voltage deactivation command is received.

When a read cell operation may be consecutively performed more than twice, the read voltage activation command is received, the read cell operation command may be consecutively received more than twice, and the voltage deactivation command is received.

When an erase cell operation may be consecutively performed more than twice, the erase voltage activation command is received, the erase cell operation command is consecutively received more than twice, and the voltage deactivation command is received.

The voltage generation circuit may be suitable for: deactivating the program voltage and activating the read voltage when the read voltage activation command is received in a state in which the program voltage has been activated, and deactivating the program voltage and activating the erase voltage when the erase voltage activation command is received in a state in which the program voltage has been activated, deactivating the read voltage and activating the program voltage when the program voltage activation command is received in a state in which the read voltage has been activated, and deactivating the read voltage and activating the erase voltage when the erase voltage activation command is received in a state in which the read voltage has been activated, and deactivating the erase voltage and activating the program voltage when the program voltage activation command is received in which the erase voltage has been activated, and deactivating the erase voltage and activating the read voltage when the read voltage activation command is received in a state in which the erase voltage has been activated.

The voltage generation circuit may include: one or more program voltage pumps suitable for generating the program voltage and for being activated in response to the program voltage activation command and being deactivated in response to the read voltage activation command, the erase voltage activation command, and the voltage deactivation command; one or more read voltage pumps suitable for generating the read voltage and for being activated in response to the read voltage activation command and deactivated in response to the program voltage activation command, the erase voltage activation command, and the voltage deactivation command; one or more erase voltage pumps suitable for generating the erase voltage and for being activated in response to the erase voltage activation command and being deactivated in response to the program voltage activation command, the read voltage activation command, and the voltage deactivation command; and one or more common voltage pumps suitable for generating common voltages and for being activated in response to two or more of the program voltage activation command, the read voltage activation command, and the erase voltage activation command and being deactivated in response to the voltage deactivation command.

A ready/busy signal indicative of a busy state in a section in which the cell operation is performed and indicative of a ready state in a section other than the section in which the cell operation is performed may be generated.

In a section in which the ready/busy signal is indicative of the busy state, a command may be unable to be received from an outside, data may be unable to be received from the outside, and data my be unable to be output to the outside.

In a section in which the ready/busy signal is indicative of the ready state, a command may be able to be received from an outside, data may be able to be received from the outside, or data may be able to be output to the outside.

In an embodiment, a nonvolatile memory system may include: a memory controller suitable for sequentially sending a program voltage activation command, a program cell operation command, and a voltage deactivation command during a program cell operation, sequentially sending a read voltage activation command, a read cell operation command, and a voltage deactivation command during a read cell operation, and sequentially sending an erase voltage activation command, an erase cell operation command, and a voltage deactivation command during an erase cell operation; and a nonvolatile memory device suitable for activating a program voltage, a read voltage, or an erase voltage response to the program voltage activation command, the read voltage activation command, or the erase voltage activation command, respectively, deactivating an activated voltage in response to the voltage deactivation command, and performing a cell operation on selected nonvolatile memory cells of a plurality of nonvolatile memory cells using the program voltage, the read voltage, or the erase voltage in response to the program cell operation command, the read cell operation command, or the erase cell operation command, respectively.

When a program cell operation is performed, the memory controller may send addresses for selecting nonvolatile cells to be programmed and data to be programmed between the program voltage activation command and the voltage deactivation command and receive read data between the read cell operation command and the voltage deactivation command.

When a program cell operation is consecutively performed more than twice, the memory controller may send the program voltage activation command, consecutively send the program cell operation command more than twice, and send the voltage deactivation command.

When a read cell operation is consecutively performed more than twice, the memory controller may send the read voltage activation command, consecutively send the read cell operation command more than twice, and send the voltage deactivation command.

When an erase cell operation consecutively performed more than twice, the memory controller may send the erase voltage activation command, consecutively send the erase cell operation command more than twice, and send the voltage deactivation command.

The nonvolatile memory device nay generate a ready/busy signal indicative of a busy state in a section in which the cell operation is performed and indicative of a ready state in a section other than the section in which the cell operation is performed may generated and send the ready/busy signal to the memory controller.

The memory controller may be suitable for: not inputting a command to the nonvolatile memory device, not inputting the data to the nonvolatile memory device, or not receiving data from the nonvolatile memory device in a section in which the ready/busy signal is indicative of the busy state, and inputting the command to the nonvolatile memory device, inputting the data to the nonvolatile memory device, or receiving the data from the nonvolatile memory device in a section in which the ready/busy signal is indicative of the ready state.

An operating method of a nonvolatile memory device, may include: activating a program voltage, a read voltage, or an erase voltage in response to a program voltage activation command, a read voltage activation command, or an erase voltage activation command, respectively; performing a cell operation using the program voltage, the read voltage, or the erase voltage in response to a program cell operation command a read cell operation command, or an erase cell operation command, respectively; and deactivating an activated voltage in response to a voltage deactivation command.

The operating method may further include receiving addresses for selecting nonvolatile memory cells to be programmed and data to be programmed between the activating of the program voltage in response to the program voltage activation command and the performing of the cell operation using the program voltage in response to the program cell operation command when program cell operation is performed.

The operating method may further include outputting data read from nonvolatile memory cells to an outside of the nonvolatile memory device between the performing of the cell operation using the read voltage and the deactivating of the activated voltage in response to the voltage deactivation command when a read cell operation is performed When a program cell operation is consecutively performed more than twice, the performing of the cell operation using the program voltage in response to the program cell operation command may be consecutively performed more than twice.

When a read cell operation is consecutively performed more than twice, the performing of the cell operation using the read voltage in response to the read cell operation command may be consecutively performed more than twice.

When an erase cell operation is consecutively performed more than twice, the performing of the cell operation using the erase voltage in response to the erase cell operation command may be consecutively performed more than twice.

DETAILED DESCRIPTION

Figure 1:
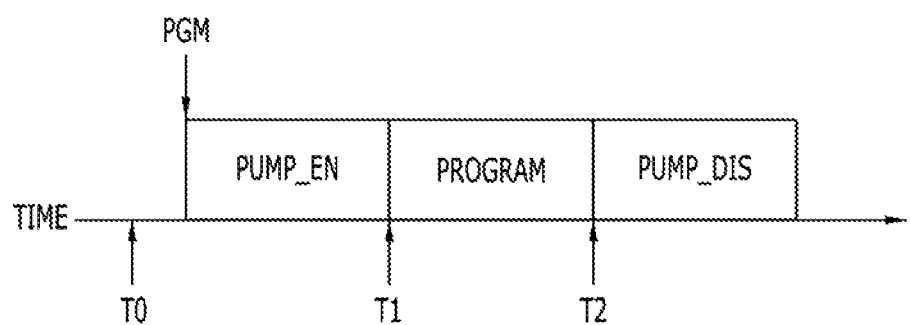
FIG. 1 is a diagram illustrating a program operation of a conventional nonvolatile memory device.

Various embodiments will be described below with reference to the accompanying drawings. The present invention may, however, be embodied in different forms and should not be construed as being limited in any way to the embodiments set forth herein. Rather, these embodiments are provided for illustration purposes only, Throughout the disclosure, like reference numerals refer to like parts throughout the various figures and embodiments of the present invention.

Figure 2:
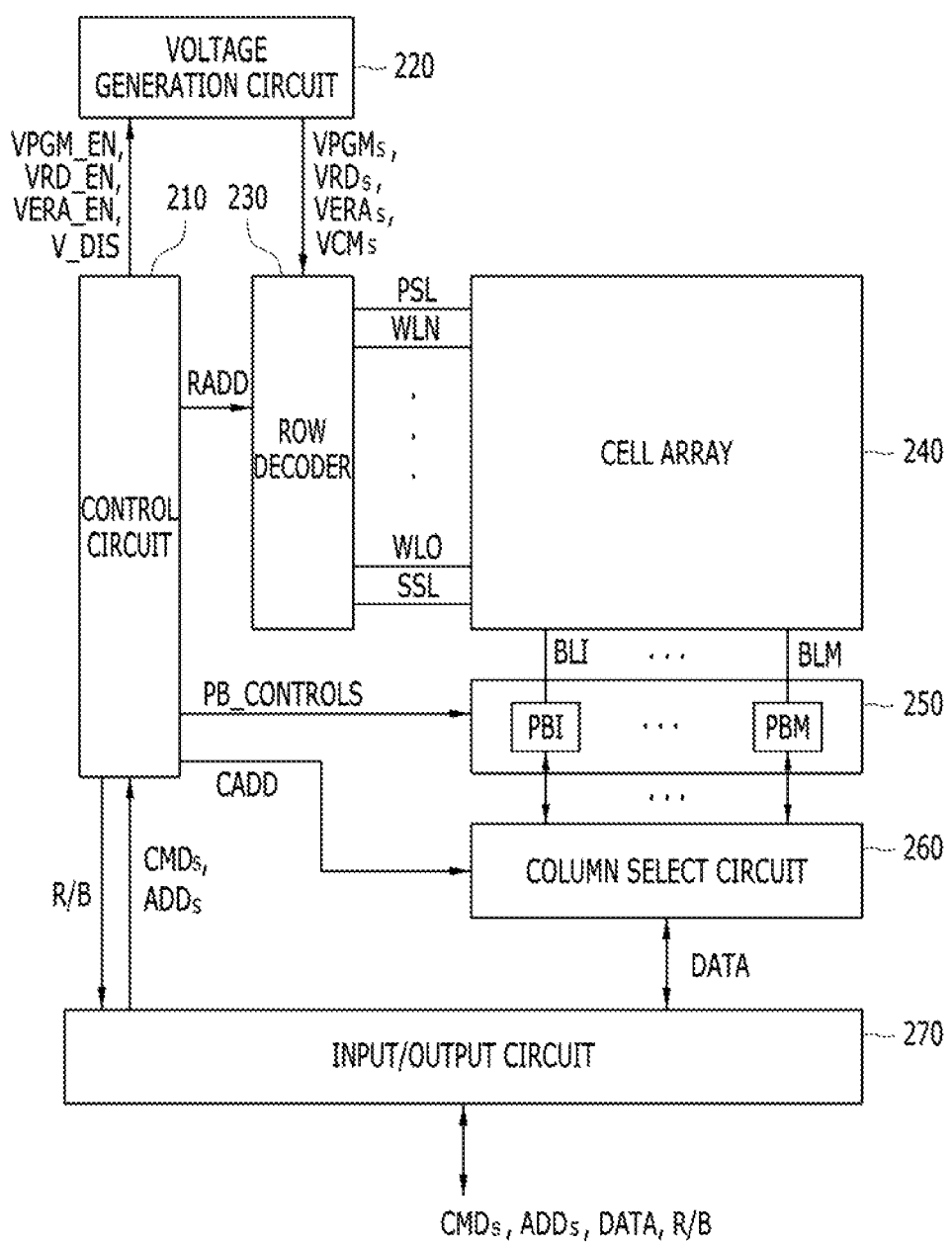
FIG. 2 is a diagram of a nonvolatile memory device, according to an embodiment of the present invention.
Figure 3:
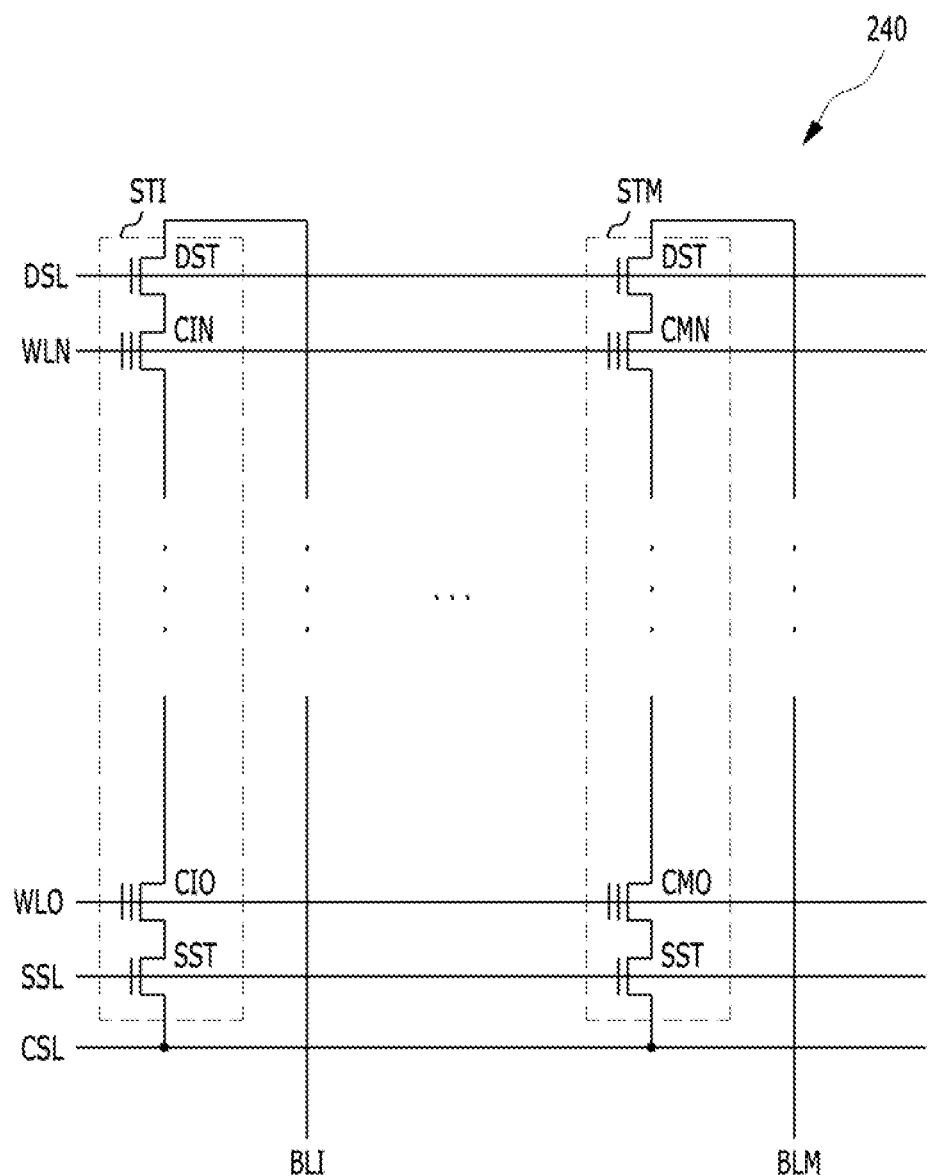
FIG. 3 is a diagram of a cell array, according to an embodiment of the invention.

Referring now to FIGS. 2 and 3, a nonvolatile memory device is provided, according to an embodiment of the invention. The nonvolatile memory device may include a control circuit 210, a voltage generation circuit 220, a row decoder 230, a cell array 240, a page buffer group or module 250, a column select circuit 260, and an input/output circuit 270.

The cell array 240, as shown in more detail in FIG. 3, may include a plurality of strings ST1 to STM coupled between bit lines BL1 to BLM and a common source line CSL. That is, each string ST1 to STM is coupled to a respective bit line BL1 to BLM and is also coupled to the common source line CSL in common. For example, string ST1 is coupled to bit line BL1, string ST2 is coupled to bit line BL2 and likewise string STM is coupled to bit line BLM. Each of the strings ST1 to STM includes a source select transistor SST having a source coupled to the common source line CSL, a plurality of memory cells CI0 to CMN, and a drain select transistor DST having a drain coupled to each of the bit lines BL1 to BLM. The memory cells CI0 to CMN are coupled in series between the select transistors SST and DST. For example, the memory cells CIO to CIN in string STI are coupled in series between corresponding transistors SST and DST. The gate of each source select transistor SST is coupled to a common source select line SSL. The gates of the memory cells CI0 to CMN are coupled to respective word lines WL0 to WLN. The gate of each drain select transistor DST is coupled to a drain select line DSL.

Examples of operations, such as Program, read, and erase operations performed by a nonvolatile memory device, according to an embodiment of the invention, are described below.

(1) Program Operation

For a program operation, peripheral circuits 220 to 270 may apply a program permission voltage (e.g., 0 V) to a selected bit line corresponding to a program permission cell and may apply a program inhibition voltage (e.g., VCC) to unselected bit lines corresponding to program inhibition cells. A voltage for turning on a corresponding drain select transistor may be applied to the drain select line DSL, a voltage for turning off a corresponding source select transistor may be applied to the source select line SSL, and a power supply voltage may be applied to the common source line CSL. Furthermore, a voltage for program may be applied to a selected word line, and a pass voltage for turning on a coupled memory cell may be applied to unselected word lines. As a result, the threshold voltage of the program permission cell may rise.

When program verification is performed, the peripheral circuits 220 to 270 may precharge the bit lines BL1 to BLM, apply a voltage for turning on selected transistors DST and SST to the selected lines DSL and SSL, apply a ground voltage to the common source line SSL, and apply a voltage for verifying a target program level to the word lines WL0 to WLN. Thereafter, the peripheral circuits 220 to 270 may detect a change of a voltage of the bit lines BL1 to BLM.

If the voltages of selected bit lines maintain a precharge state, the program operation is completed. If a discharged bit line is detected amongst the selected bit lines, the application of a program pulse and program verification are repeated. In such a case, the peripheral circuits 220 to 270 may raise the voltage applied to the gate of a program permission cell.

For ease of reference, when a program operation is performed, data to be stored in a selected memory cell may include data stored in the page buffers PB1 to PBM of the page buffer up 250.

(2) Read Operation

For a read operation, the peripheral circuits 220 to 270 may precharge the bit lines BL1 to BLM, apply a voltage for turning on selected transistors DST and SST to the selected lines DSL and SSL, and apply a ground voltage to the common source line CSL. Furthermore, the peripheral circuits 220 to 270 may apply a voltage for reading data stored in memory cells to a selected word line and may also apply a pass voltage to unselected word lines. In this case, the pass voltage may have a sufficiently high level which may activate or turn on all the memory cells regardless of the program level of each memory cell. Thereafter, the peripheral circuits 220 to 270 may detect a change in the voltages of the selected bit line BL1 to BLM and may store the detected changes.

The data read, a so referred to as results from the reading operation may be stored in the page buffers PB1 to PBM of the page buffer group 250.

(3) Erase Operation

For an erase operation, the peripheral circuits 220 to 270 may make the selected lines DSL and SSL a floating state, apply an erase permission voltage (e.g., 0 V) to the word lines WL0 to WLN, and apply an erase voltage to a bulk member such as a substrate, or a P well and the like. When erase verification is performed, the peripheral circuits 220 to 270 may precharge the bit lines BL1 to BLM, apply a voltage for turning on the se transistors DST and SST to the select lines DSL and SSL apply a ground voltage to the common source line CSL, and apply a voltage for verifying a target erase level to the word lines WL0 to WLN. Thereafter, the peripheral circuits 220 to 270 may detect a change of voltages of the bit lines BL1 to BLM. If the voltages of all the bit lines BL1 to BLM have been discharged, the erase operation is considered completed. If the voltage of a bit line that has not been discharged is detected, the application of an erase voltage and an erase verification operation are repeated. In this case, the peripheral circuits 220 to 270 may increase the erase voltage to be applied to the bulk member.

The control circuit 210 may control the peripheral circuits 220 to 270 so that the nonvolatile memory device performs an operation corresponding to commands CMDs provided through the input/output circuit 270 from an external source. The commands CMDs may include a plurality of external command signals. For example, the commands CMDs may include a program voltage activation command, a read voltage activation command, an erase voltage activation command a program command, a read command, an erase command, and a voltage deactivation command.

The control circuit 210 may enable a signal VPGM_EN when the program voltage activation command is provided, may activate a signal VRD_EN when the read voltage activation command is provided, may activate a signal VERA_EN when the erase voltage activation command is provided, and may activate a signal DIS when the voltage deactivation command is provided.

In order to perform the program, read and/or erase operations, the control circuit 210 may output PB control signals PB_CONTROLs for controlling the page buffers PB1 to PBM of the page buffer group 250.

The control circuit 210 may control the program operation using the signals VPGM_EN, PB_CONTROL, and DIS when the program operation is performed, may control the read operation using the signals VRD_EN, PB_CONTROL, and DIS when the read operation is performed, and may control the erase operation using the signals VERA_EN, PB_CONTROL, and DIS when the erase operation is performed.

The control circuit 210 may generate a ready/busy signal R/B to be output to the outside of the nonvolatile memory device. The ready/busy signal R/B may be, for example, indicative of a busy state (e.g., a logic low state) in the section in which the cell operation of the nonvolatile memory device is performed. The ready/busy signal R/B may be indicative of a ready state (e.g., a logic high state) in the section in which operations of the nonvolatile memory device other than the cell operation are performed. The ready/busy signal R/B may be indicative of a ready state in the section in which the activation or deactivation of the voltage generation circuit 220 is performed. If the ready/busy signal R/B is indicative of a ready state, the nonvolatile memory device may receive a variety of types of commands, addresses, and data from the outside or may output data to the outside. If the ready/busy signal R/B is indicative of a busy state, the nonvolatile memory device may not receive a variety of types of commands, addresses, and data from the outside or may not output data to the outside.

The voltage generation circuit 220 may generate a plurality of operating voltages, for example, VPGMs, VRDs, VERAs, and VCMs. For example, the voltage generation circuit 220 may activate one or more program voltages VPGMs and one or more common voltages VCMs when the program voltage activation command is provided (i.e., when the signal VPGM_EN is enabled), may activate one or more read voltages VRDs, and one or more common voltages VCMs when the read voltage activation command is provided (i.e., when the signal VRD_EN is enabled), and may activate one more erase voltages VERAs and one or more common voltages VCMs when the erase voltage activation command is provided (i.e., when the signal VERA_EN is enabled).

The program voltages VPGMs may be indicative of one or more voltages used in a program operation, for example, read voltages VRDs may be indicative of one or more voltages used in a read operation, read voltages VERAs may be indicative of one or more voltages used in an erase operation. Common voltages VCMs may be indicative of one or more voltages used in common in groups of two or more voltages in program, read and/or erase operations.

The row decoder 230 may transfer the operating voltages VPGMs VRDs, VERAs, and VCMs, provided by the voltage generation circuit 220, to the lines DSL, WL0 to WLN, SSL, and CSL of the cell array 270 in response to the row address signals RADD of the control circuit 210. The row address signals RADD may be used to select word lines in a program and/or read operation. For example, a selected word line and an unselected word line may be distinguished by the row address signals RADD.

The page buffer group 250 may include a plurality of page buffers PB1 to PBM coupled to the cell array 240 through the bit lines BL1 to BLM. The page buffers PB1 to PBM may be controlled by the control circuit 210 via PB control signals PB_CONTROLs.

The page buffers PB1 to PBM may latch data to be programmed into the memory cell array 240 during a program operation. Page buffers PB1 to PBM may also latch data read from a memory cell array 240 during a read operation. For example, the bit lines BL1 to BLM may be selectively precharged, and/or a change of voltages of the bit lines BL1 to BLM or the currents of the bit lines BL1 to BLM may be detected.

The column select circuit 260 may select one or more page buffers PB1 to PBM of the page buffer group 250 in response to a column address CADD output by the control circuit 210. For example, a program operation may comprise, the column select circuit 260 sequentially transferring data to be programmed into cells to the page buffers PB1 to PBM in response to a column address CADD. Or, also for example, a read operation may comprise, the column select circuit 260 sequentially selecting page buffers PB1 to PBM in response to a column address CADD so that data read from the cell array 240 and stored in the page buffers PB1 to PBM can be outputted to an external module such as a host.

The input/output circuit 270 may receive commands CMDs and/or addresses ADDs from an external source. The input/output circuit 270 may receive data to be programmed and/or output read data. For example, a program operation may comprise the input/output circuit 270 transferring data which are provided from an external source in order to program the data into memory cells, to the column select circuit 260. Or, also for example, a read operation may comprise the input/output circuit 270 handling data transferred by the column select circuit 260.

Figure 4A:
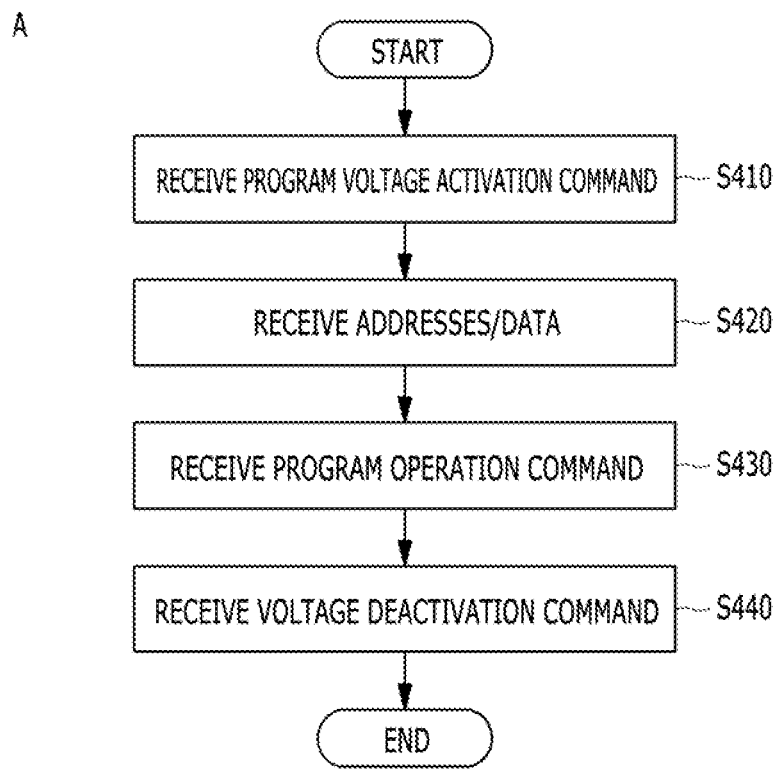
FIG. 4A is a diagram illustrating a program operation of a nonvolatile memory device, according to an embodiment of the invention
Figure 4A:
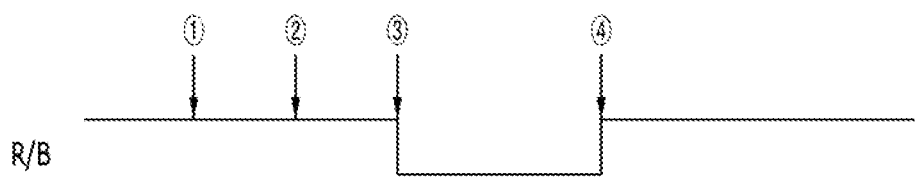
Figure 4A:
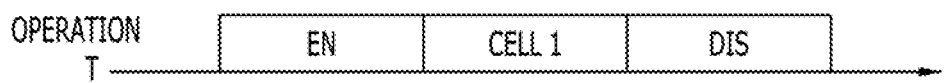

FIG. 4a4A is a diagram illustrating a program operation of the nonvolatile memory device performed once. FIG. 4A, comprises an upper Figure A which is a flowchart, and a lower Figure B which is a diagram showing an example of an operation performed by the nonvolatile memory device over time.

The program operation may include receiving a program voltage activation command at step S410, receiving addresses/data at step S420, receiving a program command at step S430, and receiving a voltage deactivation command at step S440.

At step S410, program voltage activation command is provided (①), triggering the generation of program voltages VPGMs, and also common voltages VCMs for the program operation during the voltage activation section EN. The program voltages VPGMs and the common voltages VCMs are being activated by the voltage generation circuit 220.

At step S420, addresses/data are provided also during the voltage activation section EN. For example, at step 420 the addresses/data may be provided at a time which is after the program voltage activation command is provided and prior to the time at which a program operation is started (②). Data DATA inputted to the nonvolatile memory device may be latched in the page buffers PB1 to PBM. The latch operation of the page buffers PB1 to PBM may be completed before the program command is provided (③).

At step S430, a program command is provided triggering the program operation to be performed so that data latched in one more of the page buffers PB1 to PBM may be programmed into selected memory cells. CELL1 denoted the time period during which a program operation is performed.

At step S440, a voltage deactivation command is provided (④), triggering deactivation of all the activated program voltages VPGMs and common voltages VCMs during a voltage deactivation time period or session DIS.

As shown in FIG. 4A, addresses/data ADD/DATA may be provided while voltages are being activated (EN) because a voltage activation command, a program command, and a voltage deactivation command are separated when a program operation is performed. Accordingly, efficiency of the program operation of the nonvolatile memory device can be improved.

Figure 4B:
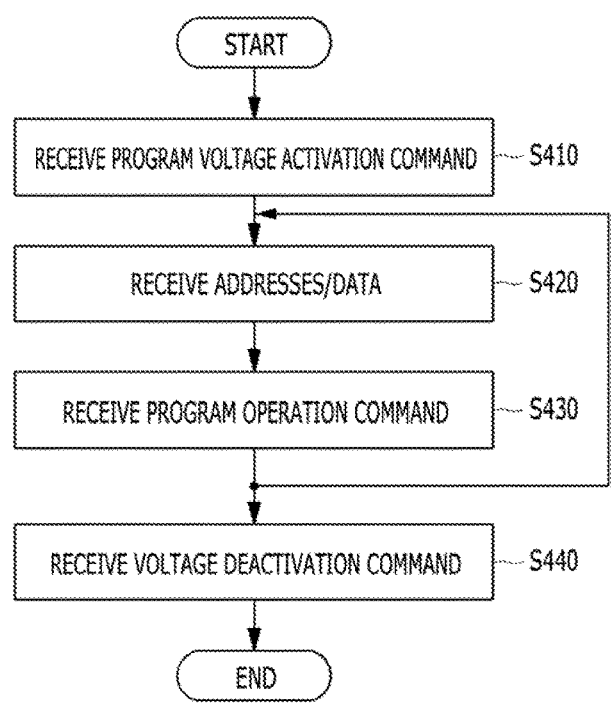
FIG. 4B is a diagram illustrating an iterative program operation of a nonvolatile memory device, according to an embodiment of the invention.
Figure 4B:
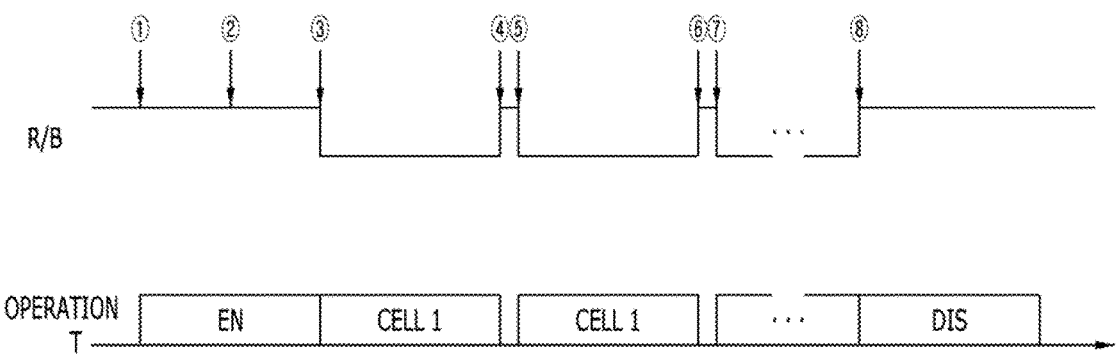

FIG. 4B is a diagram illustrating a program operation of the nonvolatile memory device which may be iterated two or more times. In FIG. 4B, an upper Figure A is a flowchart, and a lower figure B is a diagram showing an operation performed by the nonvolatile memory device over time. Steps S410 to S440 of FIG. 4B are the same as described with reference to FIG. 4A.

After a program operation is completed, a voltage deactivation command is provided at step S440 and thus the program operation may be terminated. Alternatively, addresses/data ADD/DATA is provided at step S420 and the program operation may be repeated.

In this case, since addresses data ADD/DATA for next program operation during a cell operation section CELL1 need to be provided, a section CELL1 of FIG. 4B may be set to be longer than the section CELL1 of FIG. 4A.

In FIG. 4B, ① is indicative of input of a program voltage activation command, ② is indicative of input of addresses/data, ③ is indicative of input of a program command, ④ is indicative of input of addresses/data, ⑤ is indicative of input of a program command, ⑥ is indicative of input of addresses/data, ⑦ is indicative of input of a program command, and ⑧ is indicative of input of a voltage deactivation command.

When a program operation is performed the nonvolatile memory device separates a voltage activation command, a program command, and a voltage deactivation command. Accordingly, the operation of FIG. 4B requires the time periods or sections for the activation and the deactivation of the program voltages VPGMs and the common voltages VCMs only before a first program operation and after the last program operation and the section in which a voltage is deactivated, but does not require the time periods or sections for the activation and the deactivation of the program voltages VPGMs and the common voltages VCMs between consecutive program operations. Accordingly, the time taken to consecutively perform the program operation more than, twice can be greatly reduced.

Figure 5A:
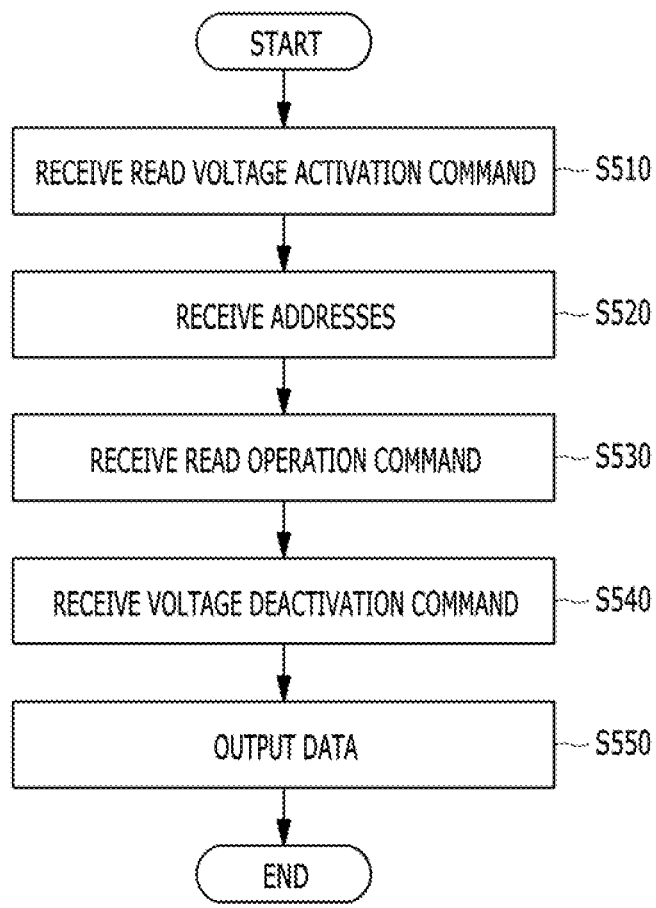
FIG. 5A is a diagram illustrating a read operation of a nonvolatile memory device, according to an embodiment of the invention.
Figure 5A:
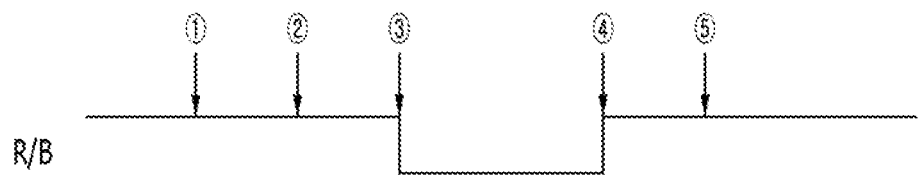
Figure 5A:
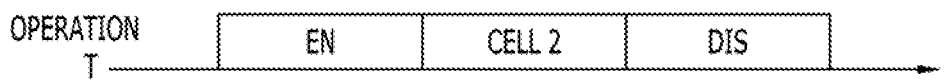

FIG. 5A is a diagram illustrating an example of a read operation of the nonvolatile memory device performed once. In FIG. 5A an upper Figure A is a flowchart, and a lower figure B is a diagram showing an operation performed by the nonvolatile memory device over time.

The read operation may include receiving a read voltage activation command at step S510, receiving addresses at step S520, receiving a read command at step S530, receiving a voltage deactivation command at step S540, and outputting data at step S550.

At step S510, a read voltage activation command is provided to the semiconductor memory device through by an external source such as a host (①). The read voltage activation command triggers read voltages VRDs to be generated (or activated, and common voltages VCMs for the read operation are activated during the voltage activation section EN. The read and common voltages are generated by the voltage generation circuit.

At step S520, the addresses ADD are provided during the voltage activation section EN (②). At step S530, when the read command is provided (③), the aforementioned read operation is performed, so data stored in the memory cell array 240 is latched in the page buffers PB1 to PBM through the read operation. CELL2 may be indicative of the section in which the read operation is performed.

At step S540, when the voltage deactivation command is provided (④), the activated program voltages VPGMs and common voltages VCMs are deactivated during a voltage deactivation section DIS.

During the voltage deactivation section DIS, the data latched in the page buffers PB1 to PBM is output to the outside of the nonvolatile memory device (⑤) at step S550.

As shown in FIG. 5A, since a voltage activation command, a program command, and a voltage deactivation command are separated when a read operation is performed, addresses n be provided during voltages are activated (EN), and data can be output during the voltages are deactivated (DIS). Accordingly, efficiency of the read operation of the nonvolatile memory device can be improved.

Figure 5B:
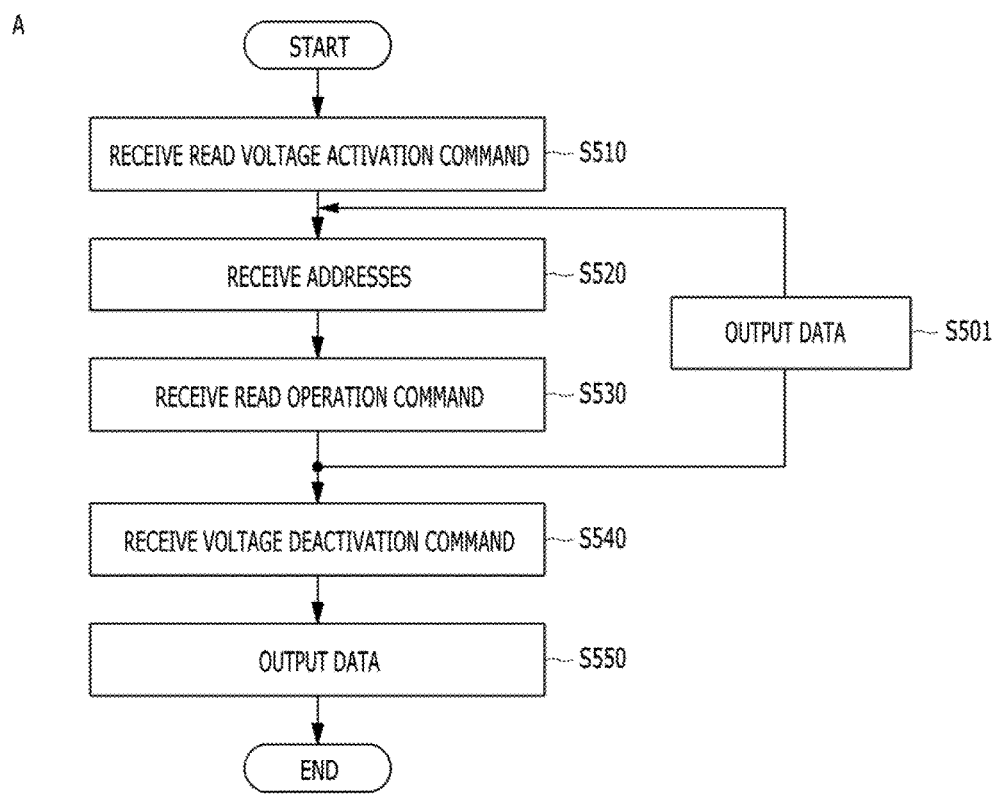
FIG. 5B is a diagram illustrating an iterative read operation of a nonvolatile memory device, according to an embodiment of the invention.
Figure 5B:
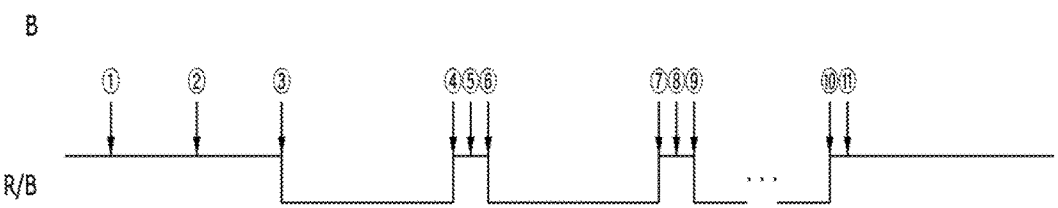
Figure 5B:

FIG. 5B is a diagram illustrating read operations of the nonvolatile memory device consecutively performed twice or more. In FIG. 5B, an upper figure A is a flowchart, and a lower figure B is a diagram showing an operation performed by the nonvolatile memory device over time. Steps S510 to S550 of FIG. 5B are the same as described with reference to FIG. 5A.

After the read operation is completed, the voltage deactivation command is provided at step S540, data is output at step S550, and thus the read operation may be terminated or data may be output at step S501, addresses ADD may be provided at step S520, and thus the read operation may be repeated.

In FIG. 5B, ① is indicative of input of the read voltage activation command, ② is indicative of input of addresses, ③ is indicative of input of the read command, ④ is indicative of input of data, ⑤ is indicative of input of addresses, ⑥ is indicative of input of the read command, ⑦ is indicative of input of data, ⑧ is indicative of input of addresses, ⑨ is indicative of input of the read command, ⑩ is indicative of input of the voltage deactivation command, and ⑪ is indicative of output of data.

When the read operation is performed, the nonvolatile memory device separate the voltage activation command, the read command, and the voltage deactivation command. Accordingly, the operation of FIG. 5B requires the sections for the activation and the deactivation of the read voltages VRDs and the common voltages VCMs only before a first read operation and after the last read operation, but does not require the sections for the activation and the deactivation of the read voltages VRDs and the common voltages VCMs between consecutive read operations. Accordingly, the time taken to consecutively perform the read operation r ore than twice can be greatly reduced.

Figure 6A:
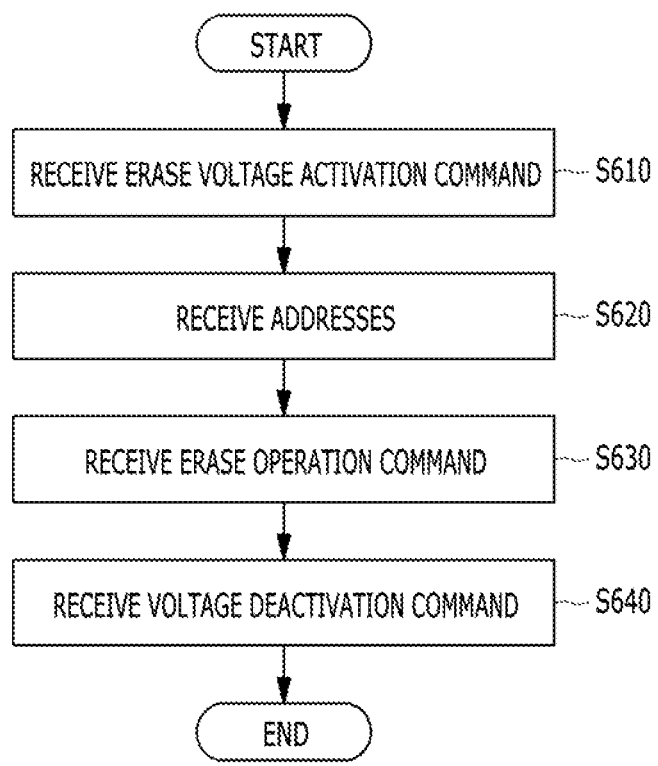
FIG. 6A is a diagram illustrating an erase operation of a nonvolatile memory device, according to an embodiment of the invention.
Figure 6A:
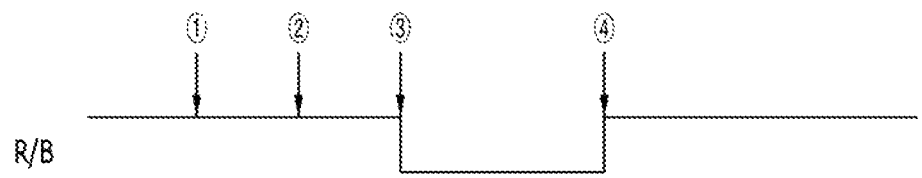
Figure 6A:
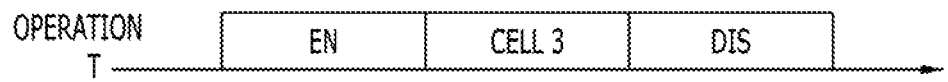

FIG. 6A is a diagram illustrating an erase operation of the nonvolatile memory device performed once. In FIG. 6A, an upper figure A is a flowchart, and a lower figure B is a diagram showing an operation performed by the nonvolatile memory device over time.

The erase operation may include receiving an erase voltage activation command at step S610, receiving addresses at step S620, receiving an erase command, at step S630, and receiving a voltage deactivation command at step S640.

At step S610, when the erase voltage activation command is provided (①), the erase voltages VERAs are activated by the voltage generation circuit 220, and common voltages for the erase operation are activated during the voltage activation section EN.

At step S620, addresses ADD are provided during the voltage activation section EN (②). An operation for receiving the addresses is completed before the erase command is provided (③).

At step S630, when the erase command is provided (③), the aforementioned erase, operation is performed, so data stored in the memory cell array 240 is erased. CELL3 may be indicative of the section in which the erase operation is performed.

At step S640, when the voltage deactivation command is provided (④), all the activated erase voltages VERAs and common voltages VCMs are deactivated during a voltage deactivation section DIS.

As shown in FIG. 6A, addresses ADD can be provided while voltages are activated (EN) because a voltage activation command, a program command, and a voltage deactivation command are separated when an erase operation is performed. Accordingly, efficiency of the erase operation of the nonvolatile memory device can be improved.

Figure 6B:
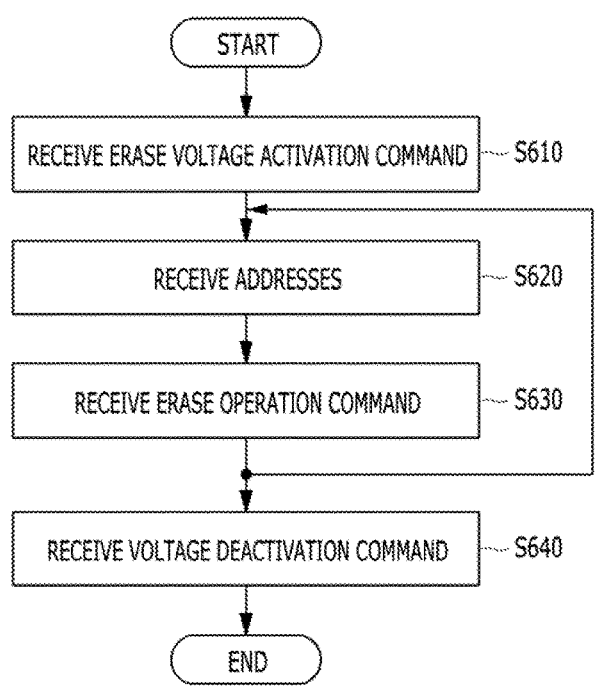
FIG. 6B is a diagram illustrating an iterative erase operation of a nonvolatile memory device, according to an embodiment of the invention.
Figure 6B:
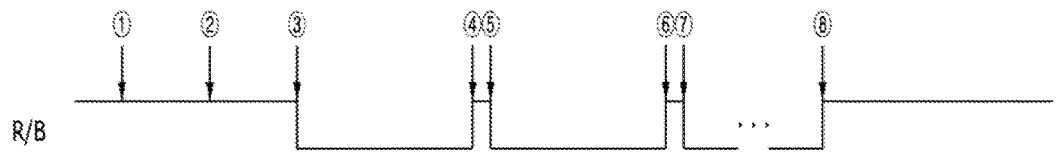
Figure 6B:
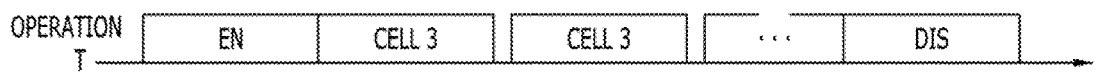

FIG. 6B is a diagram illustrating erase operations of the nonvolatile memory device consecutively performed twice or more. In FIG. 6B, an upper figure A is a flowchart, and a lower figure B is a diagram showing an operation performed by the nonvolatile memory device over time. Steps S610 to S640 of FIG. 6B are the same as described with reference to FIG. 6A.

After an erase operation is completed, the voltage deactivation command is provided at step S640 and thus the erase operation may be terminated or addresses ADD may be provided at step S620 and thus the erase operation may be repeated.

In FIG. 6B, ① is indicative of input of the erase voltage activation command, ② is indicative of input of addresses, ③ is indicative of input of the erase command, ④ is indicative of input of addresses, ⑤ is indicative of input of the erase command, ⑥ is indicative of input of addresses, ⑦ is indicative of input of the erase command, and ⑧ is indicative of input of a voltage deactivation command.

When the read operation is performed, the nonvolatile memory device separates the voltage activation command, the erase command, and the voltage deactivation command. Accordingly, the operation of FIG. 6B requires the sections for the activation and the deactivation of the erase voltages VERAs and the common voltages VCMs only before a first erase operation and after the last erase operation, but does not require the sections for the activation and the deactivation of the erase voltages VERAs and the common voltages VCMs between consecutive erase operations. Accordingly, the time taken to consecutively perform the erase operation more than twice can be greatly reduced.

FIGS. 7A to 7F are diagrams illustrating the program, read, and erase operations the nonvolatile memory device consecutively performed.

Figure 7A:
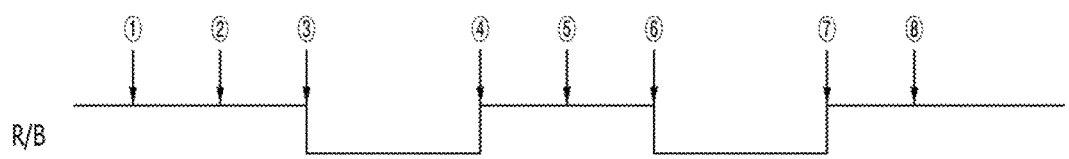
FIGS. 7A to 7F are diagrams illustrating consecutive operations of a nonvolatile memory device, according to an embodiment of the invention.
Figure 7A:
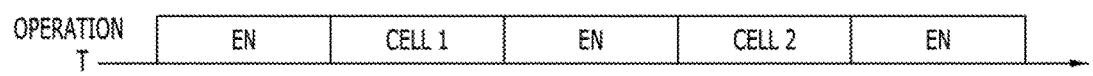

FIG. 7A is a diagram illustrating a read operation performed after a program operation.

When a program voltage activation command is provided (①), the program voltages VPGMs are activated and common voltages VCMs for the program operation are activated during a first voltage activation section EN.

During the first voltage activation section EN, addresses/data for the program operation are provided (②), and the provided data is latched in the page buffers PB1 to PBM. When the program command is provided (③), the program operation is performed, so the data latched in the page buffers PB1 to PBM is programmed into the memory cell array 240.

Next, when the read voltage activation command is provided (④), the program voltages VPGMs are deactivated and the read voltages VRDs are activated during a second voltage activation section EN. Furthermore, the activated common voltages VCMs for the program operation are deactivated, and the deactivated common voltages VCMs for the read operation are activated. Furthermore, addresses for selecting memory cells to be read may be provided during the second voltage activation section EN (⑤).

When the read command s provided (⑥), the data stored in the selected memory cell is latched in the page buffers PB1 to PBM through the read operation. When the voltage deactivation command is provided (⑦), the read voltages VRDs and the common voltages VCMs are deactivated during a voltage deactivation section DIS.

During the voltage deactivation section DIS, the data latched in the page buffers PB1 to PBM are output to the outside of the nonvolatile memory device (⑧).

Figure 7B:
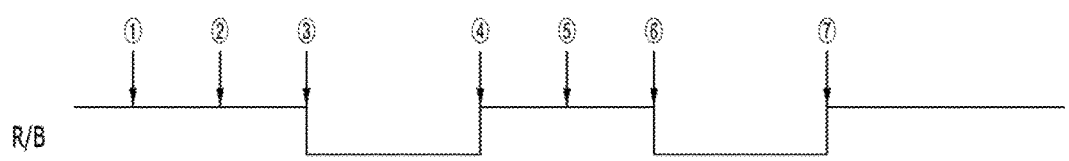
Figure 7B:
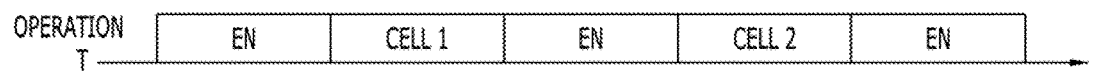

FIG. 7B is a diagram illustrating consecutive program operation and erase operation of the nonvolatile memory device. A description of portions that belong to the operation of FIG. 7B and that are identical with the operation of FIG. 7A is omitted.

When the erase voltage activation command is provided (④) after the program operation is completed, the program voltages VPGMs are deactivated and the erase voltages VERAs are activated during the second voltage activation section EN. Furthermore, the activated common voltages VCMs for the program operation are deactivated, and the deactivated common voltages VCMs for the erase operation are activated. Furthermore, addresses for selecting memory cells to be erased may be provided during the second voltage activation section EN (⑤).

When the erase command is provided (⑥), data stored in the selected memory cell is erased through the erase operation. When the voltage deactivation command is provided (⑦), the erase voltages VERAs and the common voltages VCMs are deactivated during the voltage deactivation section DIS.

Figure 7C:
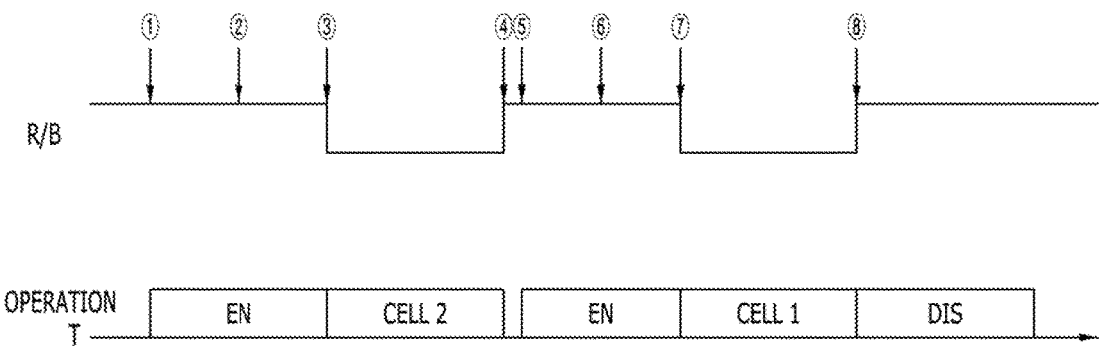

FIG. 7C is a diagram illustrating consecutive read operation and program operation of the nonvolatile memory device.

When the read voltage activation command is provided (①), the read voltages VRDs are activated and the common voltages VCMs for the read operation are activated during the first voltage activation section EN. During the first voltage activation section EN, addresses for the read operation are provided (②). When the read command is provided (③), the read operation is performed, so data stored in memory cells are read and latched in the page buffers PB1 to PBM. The data stored in the page buffers PB1 to PBM are output to the outside of the nonvolatile memory device (④).

When the program voltage activation command is provided (⑤), the program voltages VPGMs are activated and the read voltages VRDs are deactivated during the second voltage activation section EN. Furthermore, the activated common voltages VCMs for the read operation are deactivated, and the deactivated common voltages VCMs for the program operation are activated. Furthermore, addresses for selecting memory cells to be programmed and data to be programmed may be provided (⑥) in the second voltage activation section EN, and the data to be programmed may be latched in the page buffers PB1 to PBM.

When the program command is provided (⑦), the data latched in the page buffers PB1 to PBM may be programmed into the selected memory cells. When the voltage deactivation command is provided (⑧), the program voltages VPGMs and the common voltages VCMs are deactivated during the voltage deactivation section DIS.

Figure 7D:
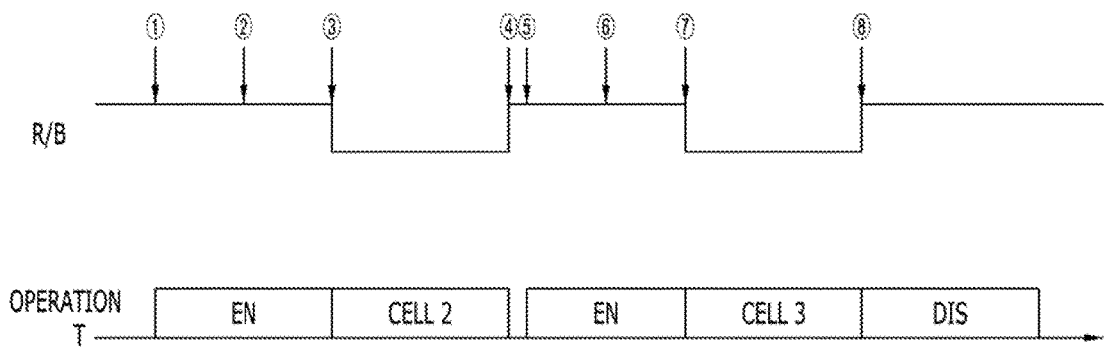

FIG. 7D is a diagram illustrating consecutive read operation and erase operation of the nonvolatile memory device. A description of portions that belong to the operation of FIG. 7D and that are identical with the operation of FIG. 7C is omitted.

When the erase voltage activation command is provided (⑤) after the read operation is completed, the read voltages VRDs are deactivated and the erase voltages VERAs are activated during the second voltage activation section EN. Furthermore, the activated common voltages VCMs for the read operation are deactivated, and the deactivated common voltages VCMs for the erase operation are activated. Furthermore, addresses for selecting memory cells to be erased may be provided during the second voltage activation section EN (⑥).

When the erase command is provided (⑦), data stored in the selected memory cells is erased through the erase operation. When the voltage deactivation command is provided (⑧), the erase voltages VERAs and the common voltages VCMs are deactivated during the voltage deactivation section DIS.

Figure 7E:
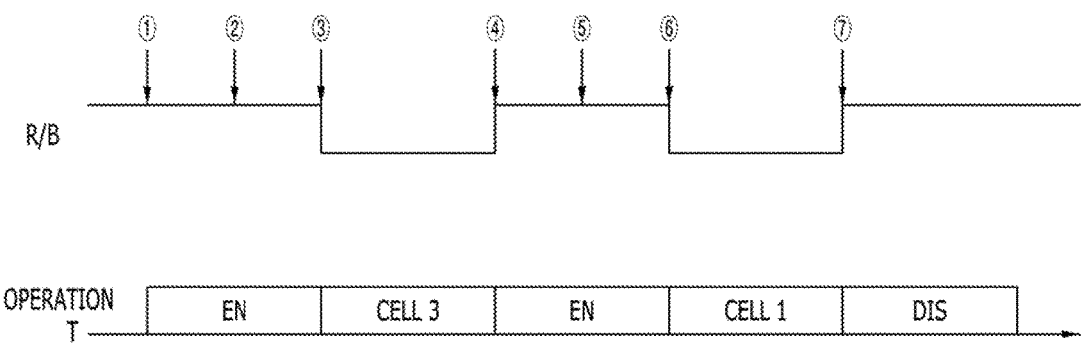

FIG. 7E is a diagram illustrating consecutive erase operation and program operation of the nonvolatile memory device.

When an erase voltage activation command is provided (①), the erase voltages VERAs and the common voltages VCMs for the erase operation are activated during a first voltage activation section EN. Furthermore, addresses for selecting memory cells to be erased may be provided during the first voltage activation section EN (②). When an erase command is provided (③), data stored in the selected memory cells is erased through the erase operation.

When the program voltage activation command is provided (④) the program voltages VPGMs are activated and the erase voltages VERAs are deactivated during the second voltage activation section EN. Furthermore, the activated common voltages VCMs for the erase operation are deactivated, and the deactivated common voltages VCMs for the program operation are activated. Furthermore, addresses for selecting memory cells to be programmed and data to be programmed may be provided (⑤) during the second voltage activation section EN, and the data to be programmed may be latched in the page buffers PB1 to PBM.

When the program command is provided (⑥), the data latched in the page buffers PB1 to PBM may be programmed into the memory cells. When the voltage deactivation command is provided (⑦), the program voltages VPGMs and the common voltages VCMs are deactivated during the voltage deactivation section DIS.

Figure 7F:
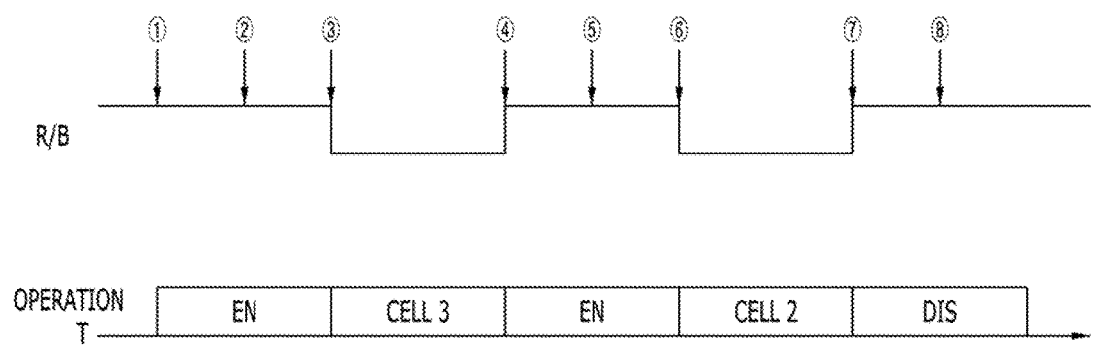

FIG. 7F is a diagram illustrating consecutive erase operation and read operation of the nonvolatile memory device. A description of portions that belong to the operation of FIG. 7F and that are identical with the operation of FIG. 7E is omitted.

When the read voltage activation command is provided (④) after an erase operation is completed, the erase voltages VERAs are deactivated and the read voltages VRDs are activated during the second voltage activation section EN. Furthermore, the activated common voltages VCMs for the erase operation are deactivated, and the deactivated common voltages VCMs for the read operation are activated. Furthermore, addresses for selecting memory cells to be read may be provided during the second voltage activation section EN (⑤).

When the read command is provided (⑥), data stored in the selected memory cells are latched in the page buffers PB1 to PBM through the read operation. When the voltage deactivation command is provided (⑦), the read voltages VRDs and the common voltages VCMs are deactivated during the voltage deactivation section DIS. The data latched in the page buffers PB1 to PBM is output to the outside of the nonvolatile memory device during the voltage deactivation section DIS (⑧).

Figure 8:
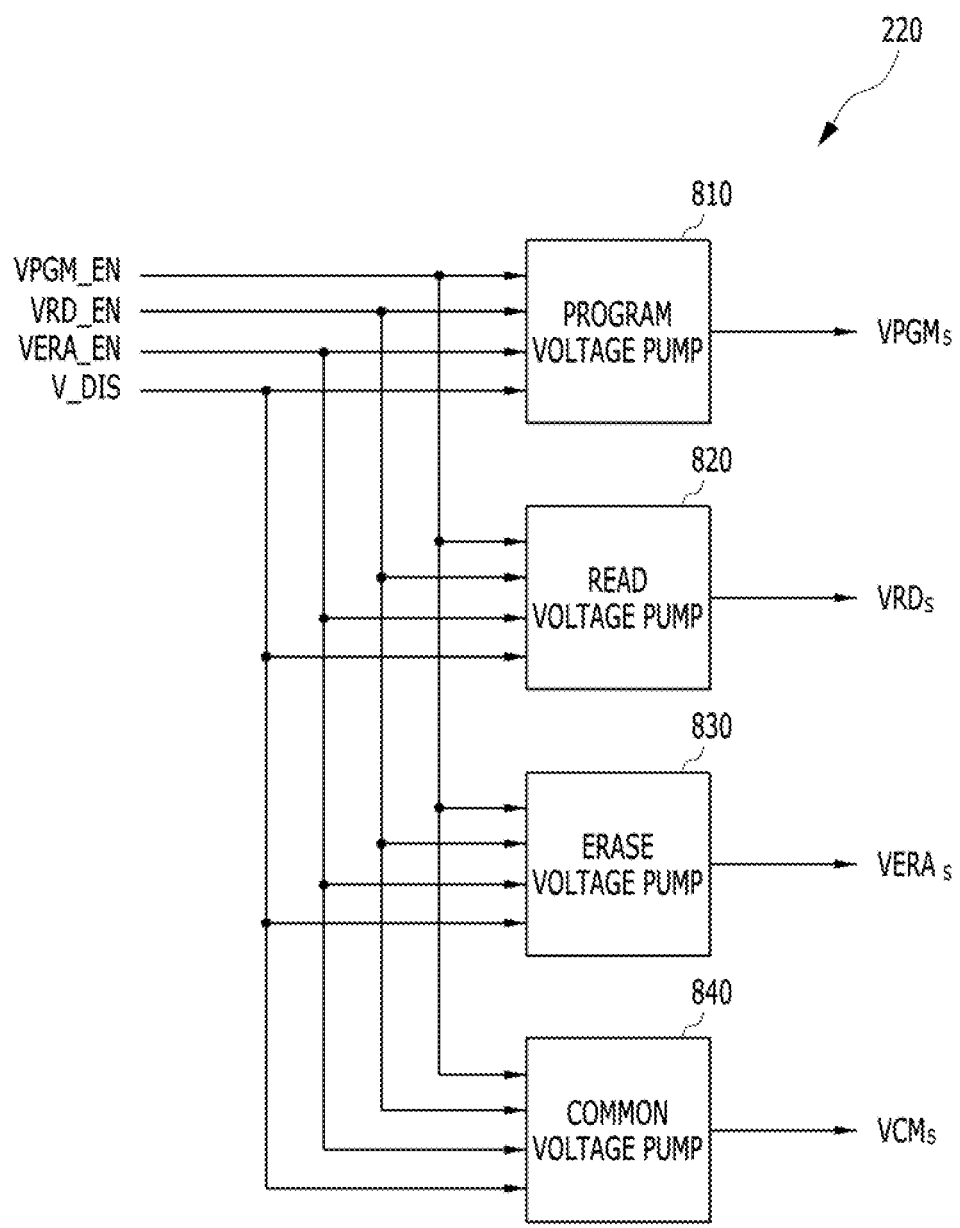
FIG. 8 is a diagram illustrating voltage, generation circuit 220, according to an embodiment of the invention.

Referring to FIG. 8, the voltage generation circuit 220 may include one or more program voltage pumps 810, one or more read voltage pumps 820, one or more erase voltage pumps 830 and one or more common voltage pumps 840.

The program voltage pump 810 may activate the program voltages VPGMs when the signal VPGM_EN is activated and may deactivate the program voltages VPGMs when the signal VRD_EN, the signal VERA_EN, or the signal DIS is activated. The read voltage pump 820 may activate the read voltages VRDs when the signal VRD_EN is activated and may deactivate the read voltages VRDs when the signal VPGM_EN, the signal VERA_EN, or the signal DIS is activated. The erase voltage pump 830 may activate the erase voltages VERAs when the signal VERA_EN is activated and may deactivate the erase voltages VERAs when the signal VPGM_EN, the signal VRD_EN, or the signal DIS is activated.

The common voltage pump 840 generates the common voltages VCMs. The common voltage VCMs may be indicative of voltages which are used in two or more of the program operation, the read operation, and the erase operation.

When the signal VPGM_EN is activated, the common voltage pump 840 may activate the common voltages VCMs for the program operation and deactivate the remaining common voltages. When the signal VRD_EN is activated, the common voltage pump 840 may activate the common voltages VCMs for the read operation and deactivate the remaining common voltages. When the signal VERA_EN is activated, the common voltage pump 840 may activate the common voltages VCMs for the erase operation and deactivate the remaining common voltages. When the signal DIS is activated, the common voltage pump 840 may deactivate all the common voltages VCMs.

Figure 9:
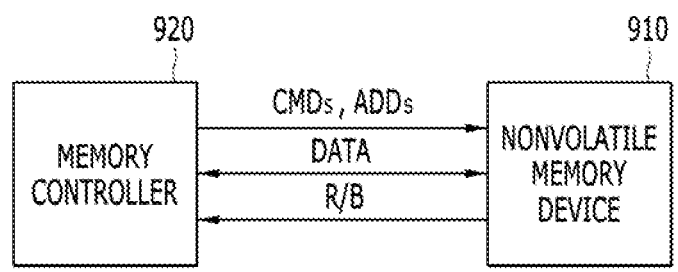
FIG. 9 is a diagram illustrating a nonvolatile memory system, according an embodiment of the invention.

Referring to FIG. 9, the nonvolatile memory system may include a nonvolatile memory device 910 and a memory controller 920.

The memory controller 920 controls the operation of the nonvolatile memory device 910 by applying the command CMDs and the addresses ADDs to the nonvolatile memory device 910 and exchanges data DATA with the nonvolatile memory device 910 through pi program and read operations. The nonvolatile memory device 910 may generate the ready/busy signal R/B and send it to the memory controller 920.

The memory controller 920 may send one or more of the program voltage activation command, the read voltage activation command, the erase voltage activation command, the program command, the read command, the erase command, and the voltage deactivation command to the nonvolatile memory device 910 through a combination of command signals forming the command CMDs. In this case, the memory controller 920 may perform such a signal transmission/reception operation along with the nonvolatile memory device 910 in the section in which the ready/busy signal R/B is indicative of a ready state and may not perform such a signal transmission/reception operation along with the nonvolatile memory device 910 in the section in which the ready/busy signal R/B is indicative of a busy state.

The nonvolatile memory device 910 may include the nonvolatile memory device of FIG. 2. The nonvolatile memory device 910 may perform the operations described with reference to FIGS. 2 to 7F in response to the command CMDs, the addresses ADDs, and data DATA transmitted by the memory controller 920.

The nonvolatile memory system can improve efficiency of the program operation, read operation, and erase operation of the nonvolatile memory device 910 by subdividing commands.

This technology can improve efficiency of the operation of a nonvolatile memory device by separating a command for controlling the voltage generation circuit and a command for controlling a cell operation from commands for controlling the access operations of the nonvolatile memory device.

Although various embodiments have been described for illustrative purposes, it will be apparent to those skilled in the art that various changes and modifications may be made without departing from the spirit and scope of the invention as defined in the following claims.

What is claimed is:

1. An operating method of a nonvolatile memory device including a nonvolatile memory cell array, the method comprising:
   activating an operation voltage in response to an operation voltage activation command;
   performing an operation to the nonvolatile memory cell array using the activated operation voltage in response to an operation command; and
   deactivating the activated operation voltage in response to an operation voltage deactivation command after the performing of the operation,
   wherein one or more of an address and an external data are provided to the nonvolatile memory device during the activating of the operation voltage, the performing of the operation, and the deactivating of the activated operation voltage, and wherein the operation voltage activation command, the operation voltage deactivation command, and the operation command are independently provided from an external source.

2. The operating method of claim 1, the performing of the operation comprises:
programming the external data into the nonvolatile memory cell array in response to a program command as the operation command;
reading data from the nonvolatile memory cell array in response to a read command as the operation command, and outputting the read data; and
erasing data of the nonvolatile memory cell array in response to an erase command as the operation command.

3. The operating method of claim 1, further comprising latching the external data after the activating of the operation voltage and before the performing of the operation in response to a program command as the operation command.

4. The operating method of claim 1, further comprising, after the performing the operation in response to a read operation as the operation command, outputting data read from the nonvolatile memory cell array.

5. The operating method of claim 1,
wherein the operation command includes consecutive two or more of the predetermined operation commands, and the performing of the operation performs a predetermined operation consecutively twice or more between the activating the operation voltage and the deactivating of the activated operation voltage.

6. An operating method of a nonvolatile memory device, comprising:
activating a program voltage, a read voltage, or an erase voltage in response to an operation voltage activation command including a program voltage activation command, a read voltage activation command, or an erase voltage activation command, respectively;
performing a cell operation using the program voltage, the read voltage, or the erase voltage in response to an operation command including a program cell operation command, a read cell operation command, or an erase cell operation command, respectively; and
deactivating an activated voltage in response to a voltage deactivation command,
wherein the operation voltage activation command, the voltage deactivation command, and the operation command are independently provided from an external source.

7. The operating method of claim 6, further comprising receiving addresses for selecting nonvolatile memory cells to be programmed and data to be programmed between the activating of the program voltage in response to the program voltage activation command and the performing of the cell operation using the program voltage in response to the program cell operation command when a program cell operation is performed.

8. The operating method of claim 6, further comprising outputting data read from nonvolatile memory cells to an outside of the nonvolatile memory device between the performing of the cell operation using the read voltage and the deactivating of the activated voltage in response to the voltage deactivation command when a read cell operation is performed.

9. The operating method of claim 6, wherein when a program cell operation is consecutively performed more than twice, the performing of the cell operation using the program voltage in response to the program cell operation command is consecutively performed more than twice.

10. The operating method of claim 6, wherein when a read cell operation is consecutively performed more than twice, the performing of the cell operation using the read voltage in response to the read cell operation command is consecutively performed more than twice.

11. The operating method of claim 6, wherein when an erase cell operation is consecutively performed more than twice, the performing of the cell operation using the erase voltage in response to the erase cell operation command is consecutively performed more than twice.

12. The operating method of claim 6, wherein external input data is latched between a point of time at which the program voltage activation command is received and a point of time at which a cell operation is started.

* * * * *